(12) United States Patent
Beausoleil et al.

(10) Patent No.: US 7,739,093 B2
(45) Date of Patent: Jun. 15, 2010

(54) METHOD OF VISUALIZATION IN PROCESSOR BASED EMULATION SYSTEM

(75) Inventors: William F. Beausoleil, Hopewell Jct, NY (US); Lawrence A. Thomas, W. Hurley, NY (US); Arthur P. Sarkisian, Tillson, NY (US); Beshara Elmufdi, Sunnyvale, CA (US)

(73) Assignee: Quickturn Design System, Inc., San Jose, CA (US)

( * ) Notice: Subject to any disclaimer, the term of this patent is extended or adjusted under 35 U.S.C. 154(b) by 1322 days.

(21) Appl. No.: 11/047,802

(22) Filed: Jan. 31, 2005

(65) Prior Publication Data

US 2005/0267732 A1    Dec. 1, 2005

(51) Int. Cl.
G06F 17/50 (2006.01)
G06F 9/455 (2006.01)
(52) U.S. Cl. .......................................... 703/14; 703/23
(58) Field of Classification Search ................... 703/14, 703/23
See application file for complete search history.

(56) References Cited

U.S. PATENT DOCUMENTS

| 4,914,612 | A | 4/1990 | Beece et al. | 703/15 |
|---|---|---|---|---|
| 5,036,473 | A | 7/1991 | Butts et al. | 703/23 |
| 5,109,353 | A | 4/1992 | Sample et al. | 716/17 |
| 5,425,036 | A | 6/1995 | Liu et al. | 714/735 |
| 5,448,496 | A | 9/1995 | Butts et al. | 716/16 |
| 5,452,239 | A | 9/1995 | Dai et al. | 703/19 |
| 5,475,830 | A | 12/1995 | Chen et al. | 716/16 |
| 5,551,013 | A | 8/1996 | Beausoleil et al. | 703/23 |
| 5,574,388 | A | 11/1996 | Barbier et al. | 326/41 |
| 5,644,515 | A | 7/1997 | Sample et al. | 703/23 |
| 5,661,662 | A | 8/1997 | Butts et al. | 716/16 |
| 5,680,583 | A | 10/1997 | Kuijsten | 703/23 |
| 5,754,827 | A | 5/1998 | Barbier et al. | 703/14 |
| 5,761,488 | A | 6/1998 | Donath et al. | 703/13 |
| 5,777,489 | A | 7/1998 | Barbier et al. | 326/40 |
| 5,784,427 | A | 7/1998 | Bennett et al. | 377/72 |
| 5,790,832 | A | 8/1998 | Barbier et al. | 703/28 |
| 5,822,564 | A | 10/1998 | Chilton et al. | 703/28 |
| 5,841,967 | A | 11/1998 | Sample et al. | 714/33 |
| 5,884,066 | A | 3/1999 | Kuijsten | 703/28 |
| 5,907,697 | A | 5/1999 | Barbier et al. | 716/16 |
| 5,920,712 | A | 7/1999 | Kuijsten | 703/23 |
| 5,923,865 | A | 7/1999 | Chilton et al. | 703/23 |
| 5,943,490 | A | 8/1999 | Sample | 703/28 |
| 5,946,472 | A | 8/1999 | Graves et al. | 703/6 |
| 5,963,736 | A | 10/1999 | Sarno et al. | 703/27 |
| 5,970,240 | A * | 10/1999 | Chen et al. | 703/25 |
| 5,999,725 | A | 12/1999 | Barbier et al. | 703/28 |
| 6,035,117 | A | 3/2000 | Beausoleil et al. | 703/25 |
| 6,051,030 | A | 4/2000 | Beausoleil et al. | 703/28 |
| 6,057,706 | A | 5/2000 | Barbier et al. | 326/39 |
| 6,058,492 | A | 5/2000 | Sample | 714/33 |

(Continued)

*Primary Examiner*—Paul L Rodriguez
*Assistant Examiner*—Eunhee Kim
(74) *Attorney, Agent, or Firm*—Orrick, Herrington & Sutcliffe LLP

(57) ABSTRACT

A processor-based emulation system for emulating an integrated circuit design, the processor-based emulation system including emulation circuitry and capture circuitry. The capture circuitry is operable to capture processing results from the emulation circuitry. The captured processing results can be used to identify functional errors in the integrated circuit design. Because the processor-based emulation system includes capture circuitry, emulation circuitry is not used for capturing the processing results.

18 Claims, 4 Drawing Sheets

U.S. PATENT DOCUMENTS

| | | | |
|---|---|---|---|
| 6,061,511 A | 5/2000 | Marantz et al. | 703/28 |
| 6,141,636 A | 10/2000 | Sarno et al. | 703/23 |
| 6,173,425 B1 * | 1/2001 | Knaack et al. | 714/718 |
| 6,223,148 B1 | 4/2001 | Stewart et al. | 703/25 |
| 6,240,376 B1 | 5/2001 | Raynaud et al. | 703/15 |
| 6,446,249 B1 | 9/2002 | Wang et al. | 716/17 |
| 6,457,141 B1 * | 9/2002 | Kim et al. | 714/30 |
| 6,523,155 B1 | 2/2003 | Ruedinger | 716/7 |
| 6,539,535 B2 | 3/2003 | Butts et al. | 716/17 |
| 6,618,698 B1 | 9/2003 | Beausoleil et al. | 703/23 |
| 6,782,355 B1 | 8/2004 | Cook et al. | 703/23 |
| 6,832,185 B1 | 12/2004 | Musselman et al. | 703/23 |
| 2001/0010036 A1 | 7/2001 | Stewart et al. | 703/23 |

* cited by examiner

METHOD OF VISUALIZATION IN PROCESSOR BASED EMULATION SYSTEM

CROSS-REFERENCE TO RELATED APPLICATION

This application claims priority to U.S. Provisional Application Ser. No. 60/576,123, filed on Jun. 1, 2004. Priority to this provisional application is expressly claimed, and the disclosure of the provisional application is hereby incorporated by reference in its entirety.

FIELD

The present disclosure relates to processor-based emulation systems and, in particular, to a processor-based emulation system having dedicated capture circuitry.

BACKGROUND

Hardware emulation systems are designed for verifying electronic circuit designs prior to fabrication as chips or printed circuit boards. Typical emulation systems utilize either programmable logic chips interconnected by programmable interconnect chips or processor chips that are programmably interconnected. In programmable logic chip (e.g., field programmable gate array, or FPGA) based emulation systems, the logic contained in the user's design (often referred to as either the "design under verification" ("DUV") or "design under test" ("DUT")) is programmed into the logic chip such that the logic embodied in the DUV takes actual operating form in the programmable logic devices. In processor-based emulation systems, the user's design is processed so that its functionality appears to be created in the processors by calculating the outputs of the design. The logic itself is not implemented in a processor-based emulation system, meaning that the DUV does not take actual operating form in the processors. The outputs of the processors will however be equivalent to the outputs of the logic in the actual implementation. Examples of hardware logic emulation systems using programmable logic devices can be seen in, for example, U.S. Pat. Nos. 5,109,353, 5,036,473, 5,475,830 and 5,960,191. U.S. Pat. Nos. 5,109,353, 5,036,473, 5,475,830 and 5,960, 191 are incorporated herein by reference. Examples of hardware logic emulation systems using processor chips can be seen in, for example, U.S. Pat. Nos. 5,551,013, 6,035,117 and 6,051,030. U.S. Pat. Nos. 5,551,013, 6,035,117 and 6,051, 030 are incorporated herein by reference.

Visualization, also referred to as tracing, is an important feature in processor-based emulation systems. Visualization is the ability for a user to capture and observe the states of elements in the design being emulated. The ability to observe the state of every node (i.e., processor output) of a particular integrated circuit design, which Cadence Design Systems refers to as "Full-Vision", is a very important feature for functional verification systems. Full-Vision is needed over certain periods of time, i.e., over a number of clock cycles. By capturing the internal states of the nodes during emulation, the user can observe the activity in the design being emulated and therefore be able to debug the design. Without the ability to observe the internal states of the nodes during emulation, it would be very difficult for a user to understand the cause of any bugs in the design.

Typically, Full-Vision is achieved by capturing a strategic fraction of the nodes in the system. Those outputs are then used to calculate the values of any other node in the system. This allows the user to observe the activity on all nodes of the design, some values being physical samples, while others are derived from calculations. This strategic sampling technique is advantageous because it does not require circuitry to capture every node in the system, yet it still allows the user to observe the activity on any node in the system.

Conventional processor-based emulation systems use emulation resources to capture the states of elements in the design. Emulation resources are the circuitry that is used to emulate the integrated circuit design being tested (e.g., the emulation processors). The amount of emulation resources required to capture the internal states of the design is not trivial. For example, to achieve Full-Vision, approximately 20% of the emulation resources are used. Even if Full-Vision is not required, a significant amount of emulation resources must still be used to capture the internal states of the design. Similarly, a significant amount of memory resources that could be used for emulation are used to capture the internal states of the design. A user must therefore make a tradeoff between using processor resources and memory resources to perform emulation functions or capture functions.

Conditional acquisition is another important feature in processor-based emulation systems. Conditional acquisition allows a user to capture data at a point in time that is "interesting" while ignoring data from other times based on a trigger. A trigger is a predetermined event that causes data to begin being captured. Conditional acquisition also provides an efficient way to use the available capture resources in the system.

Conventional processor-based emulation systems also use emulation resources for conditional acquisition. Specifically, emulation resources are used to store data output from the emulation processors until the trigger condition is calculated. The data output from the emulation processors must be stored because that data is usually available before the trigger condition is calculated.

Thus, there is a need for an improved method and apparatus for capturing data generated in a processor-based emulation system.

SUMMARY

The various embodiments disclosed herein provide an improved processor-based emulation system. The emulation system includes an emulation engine having emulation processors, dedicated capture resources, and memory. The dedicated capture resources are used to capture data generated by the emulation processors and to provide the captured data to the memory. A user can then examine the captured data in the memory to aid in the debugging of an integrated circuit design. By providing dedicated capture resources, the emulation processors are not used for data capture. Thus, larger integrated circuit designs can be emulated in a given emulation engine.

The above and other preferred features and advantages of the various embodiments disclosed herein, including various novel details of implementation and combination of elements will now be more particularly described with reference to the accompanying drawings and as set forth in the claims. It will be understood that the particular methods and circuits are shown by way of illustration only and not as limitations. As will be understood by those skilled in the art, the principles and features disclosed herein may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

DETAILED DESCRIPTION

Turning to the figures, exemplary embodiments will now be described.

Figure 1:
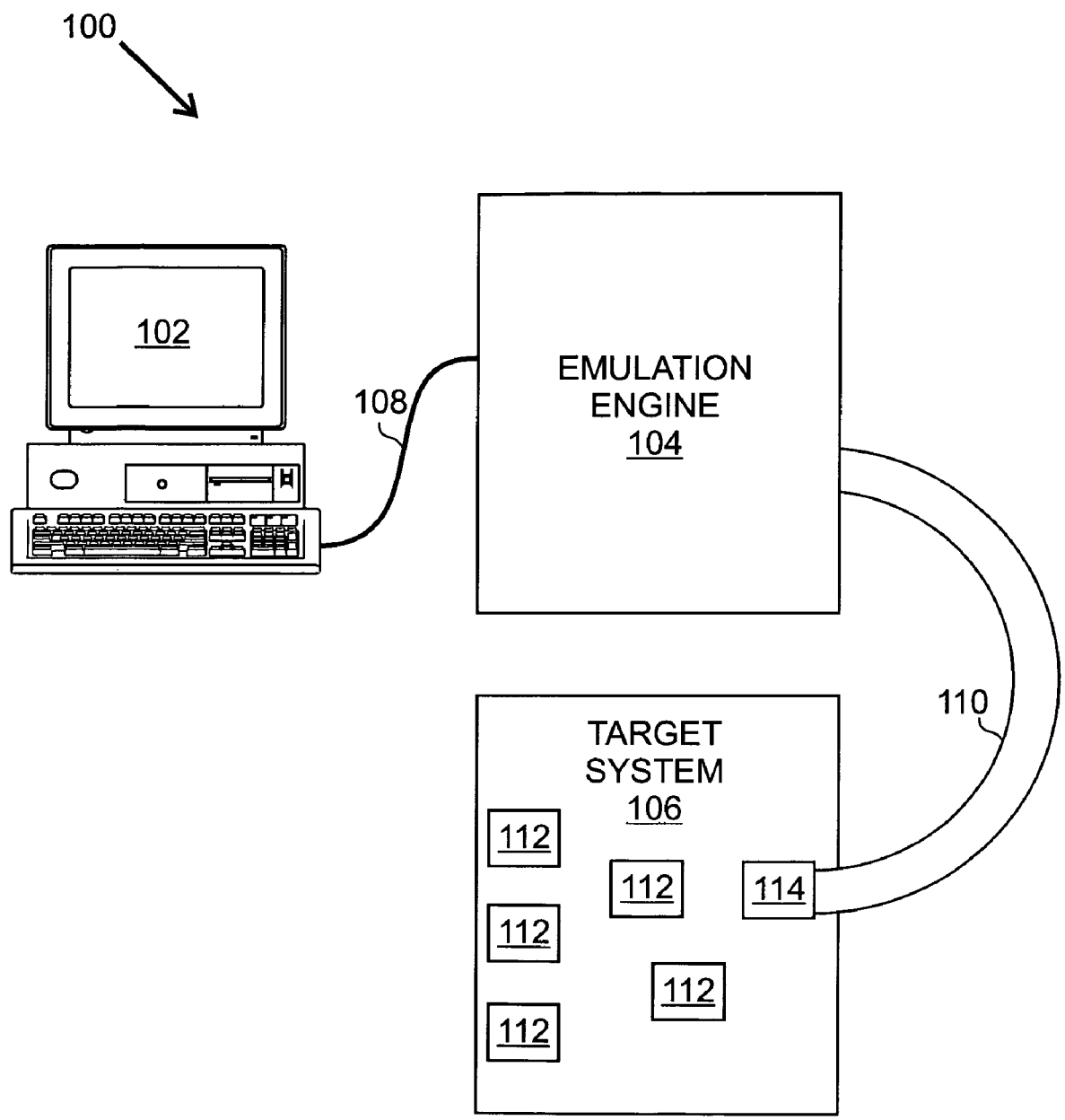
FIG. 1 shows an exemplary processor-based emulation system.

An exemplary processor-based emulation system 100 is shown in FIG. 1. Processor-based emulation system 100 allows an integrated circuit design to be tested in an intended target system 106 before the integrated circuit design is actually implemented in an integrated circuit. Processor-based emulation system 100 includes a host computer 102 and an emulation engine 104, which in turn is connected to a target system 106. Host computer 102 and emulation engine 104 communicate with one another via communication link 108. Emulation engine 104 and target system 106 communicate with one another via communication link 110. As used herein, a communication link can be any type of link that allows data to be transferred such as electrical, optical, or wireless communication links. Host computer 102 can be any type of computer that is capable of communicating with emulation engine 104. Emulation engine 104, as described in detail below, emulates the functionality of an integrated circuit design and allows a user to observe how the integrated circuit design operates in target system 106.

Target system 106 typically includes multiple devices 112 such as memory, microprocessors, application specific integrated circuits (ASIC), field programmable gate arrays (FPGAs), etc. Target system 106 also includes inputs/outputs 114. Inputs/outputs 114 correspond to the inputs and outputs of the integrated circuit being emulated and are in electrical communication with communication link 110.

To emulate an integrated circuit design, a user first creates an integrated circuit design, which is typically accomplished using integrated circuit design software. The user's design is sometimes referred to as a "design under test" ("DUT") or a "design under verification" ("DUV"). The integrated circuit design software operates on host computer 102 or another computer. When the user has completed the integrated circuit design, the design is compiled into a data format that is compatible with emulation engine 104. Next, the compiled design is loaded into emulation engine 104 via host computer 102. Emulation engine 104, which emulates the integrated circuit design, is then operated with target system 106 to determine whether the integrated circuit design operates properly in target system 106. When connected to a target system 106, the inputs and outputs of the integrated circuit design are transmitted through inputs/outputs 114 in target system 106 via communication link 110.

Testing and functionally verifying integrated circuit designs using processor-based emulation system 100 can save a tremendous amount of time and money when there are functional errors in the integrated circuit design. This is because functional errors in integrated circuit designs, which are common, can be identified and fixed before the integrated circuit design is implemented in an actual integrated circuit device.

To identify the functional errors in the integrated circuit design, emulation systems capture debugging information (i.e., information about the internal states of the integrated circuit design) during the emulation. Once captured, this information is transferred to host computer 102 via communication link 108. Using the host, the user can then observe the debugging information and use this information to identify and fix functional errors in the design.

Figure 2:
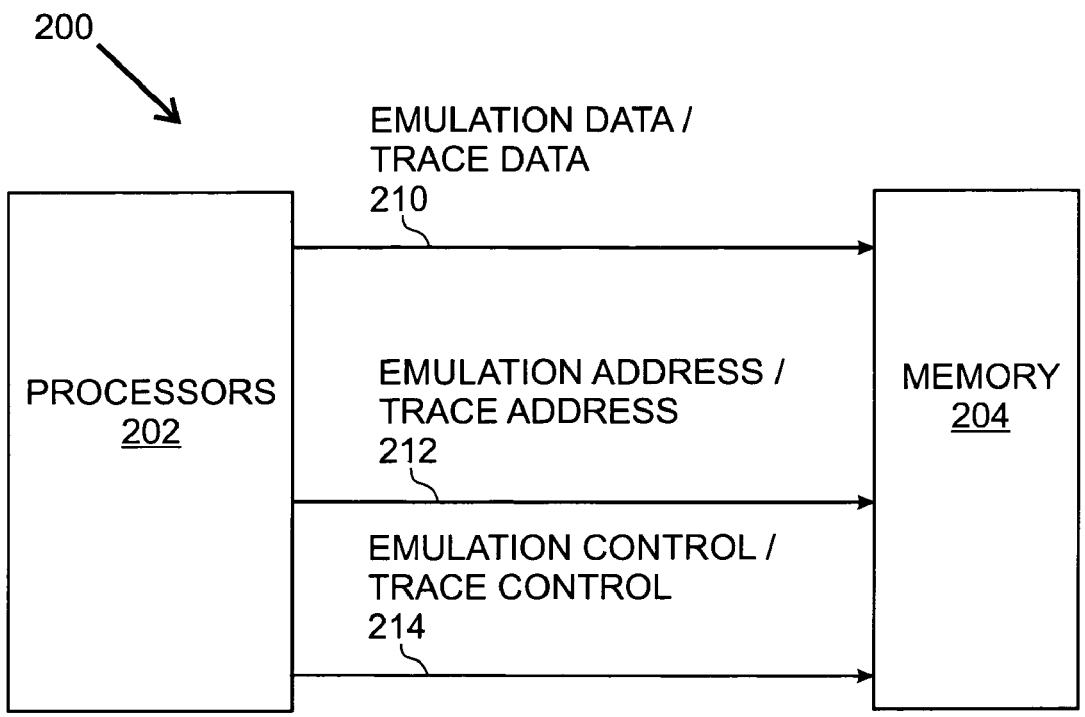
FIG. 2 shows an exemplary conventional processor-based emulation engine.

FIG. 2 shows a conventional processor-based emulation engine 200. Conventional processor-based emulation engines can be implemented in a processor-based emulation system, such as processor-based emulation system 100 shown in FIG. 1. Conventional processor-based emulation engine 200 includes processor system 202 and memory 204. Processor system 202 typically includes multiple emulation processors (not shown) and other logic (not shown). Communication link 210 is used to transfer emulation data and trace data from emulation processors 202 to memory 204. Communication link 212 is used to transfer emulation address signals and trace address signals from emulation processors 202 to memory 204. Similarly, communication link 214 is used to transfer emulation control signals and trace control signals from emulation processors 202 to memory 204.

In conventional processor-based emulation engines, such as emulation engine 200, the emulation processors within processor system 202 are used to emulate integrated circuit designs. The emulation processors, however, are also used to capture the internal states of the integrated circuit design during emulation. As mentioned above, using the emulation processors to capture internal states of the design is undesirable because it can significantly reduce the amount of emulation resources that can be used for emulation. This limits the size of the integrated circuit design that can be emulated in an emulation engine of a given size. This is a significant disadvantage because integrated circuit designs are continually becoming larger and more complex. It is therefore desirable to use the emulation processors for executing Boolean logic within the design rather than being used for capture circuitry.

Figure 3:
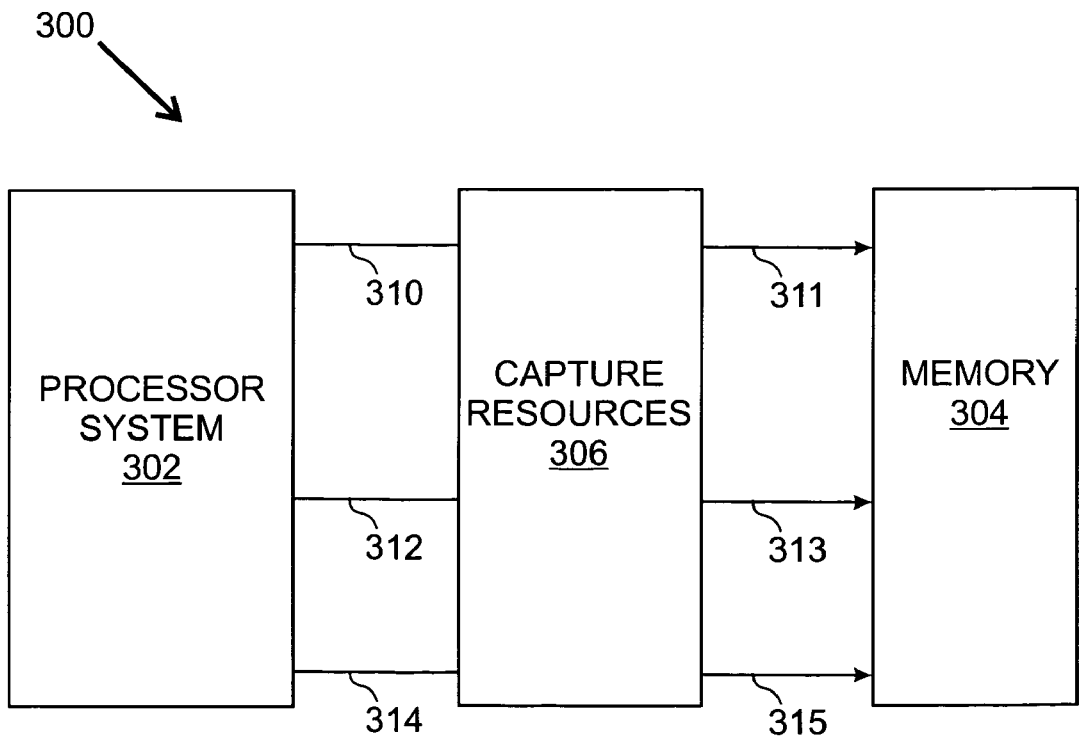
FIG. 3 shows an exemplary processor-based emulation engine in accordance with embodiments described herein.

FIG. 3 shows a processor-based emulation engine 300 in accordance with embodiments the various embodiments disclosed herein. Processor-based emulation engine 300 can be implemented in a processor-based emulation system, such as processor-based emulation system 100 shown in FIG. 1. Processor-based emulation engine 300 includes processor system 302, memory 304, and capture resources 306. Processor system 302 includes multiple emulation processors (not shown). Emulation processors are specialized circuitry designed to emulate integrated circuit designs. Capture resources 306 allow processor-based emulation engine 300 to overcome the disadvantages of conventional processor-based emulation engines discussed above. Processor system 302, capture resources 306 and memory 304 are preferably manufactured on either the same integrated circuit or a common substrate or backplane.

Capture resources 306 are dedicated resources used to capture data generated by the emulation processors in processor system 302 and to transfer the captured data to memory 304. Capture resources 306 are not used for emulating the integrated circuit design. Because capture resources 306 are not used for emulating the integrated circuit design, the emulation processors within processor system 302 can be used solely to emulate the functionality of the integrated circuit design. This allows larger and more complex integrated circuit designs to be emulated in an emulation engine of a given size.

Emulation data and trace data is transferred between processors 302 and capture resources 306 via communication link 310 and between capture resources 306 and memory 304 via communication link 311. Emulation address signals and trace address signals are transferred between processors 302 and capture resources 306 via communication link 312 and between capture resources 306 and memory 304 via communication link 313. Emulation control signals and trace control signals are transferred between processors 302 and capture resources 306 via communication link 314 and between capture resources 306 and memory 304 via communication link 315.

Capture resources 306 capture the outputs of selected emulation processors within processor system 302. The amount of data captured can vary depending on the requirements of the user. For example, if a user only needs limited visibility into the design, capture resources 306 can capture a limited amount of data and provide that data to memory 304. Capture resources 306 can also capture data based on a trigger, i.e., capture data when one or more predetermined conditions occur.

Figure 4A:
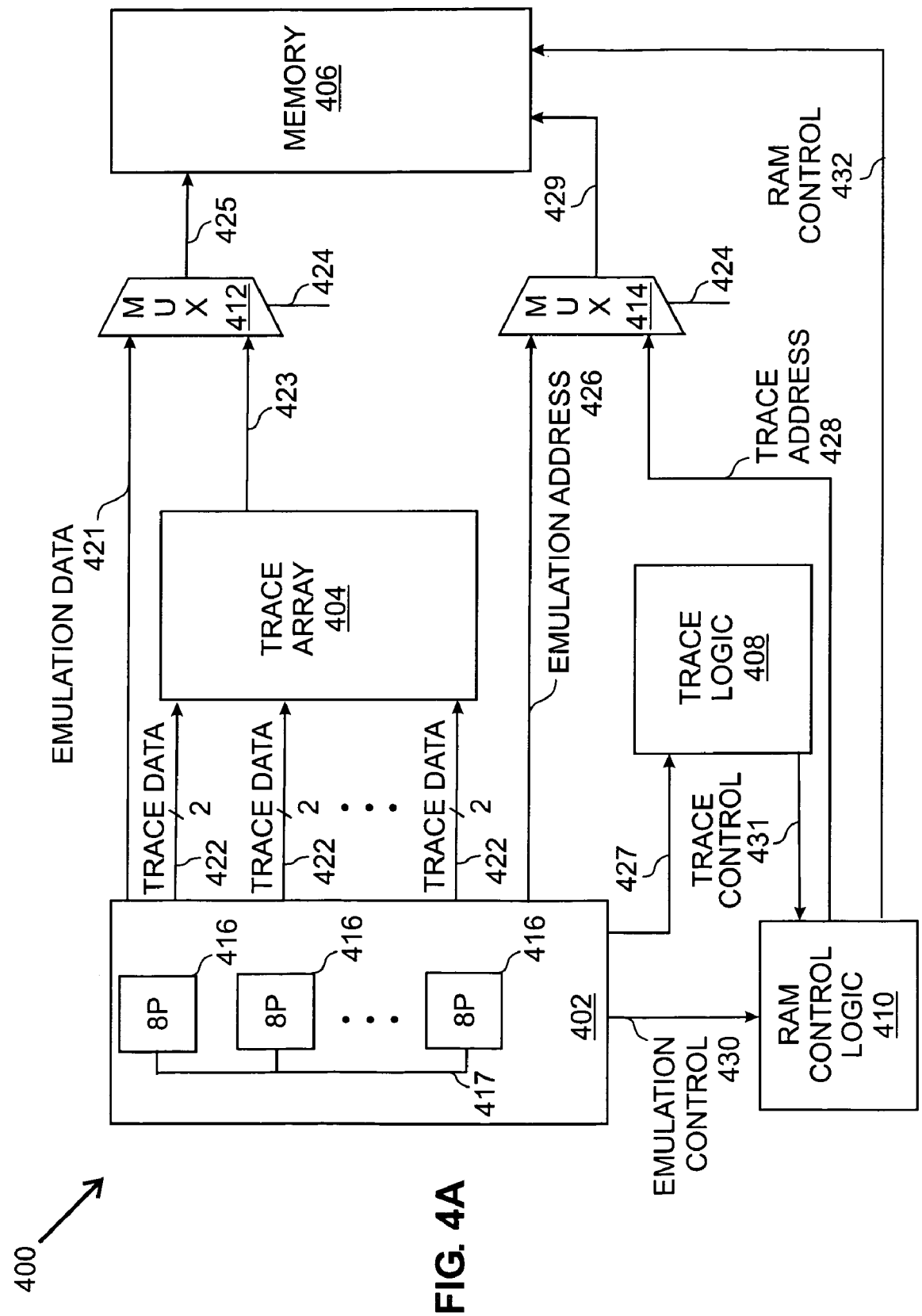
FIG. 4A shows an exemplary processor-based emulation engine in accordance with embodiments described herein.

FIG. 4A shows an exemplary processor-based emulation engine 400. Processor-based emulation engine 400 can be implemented in a processor-based emulation system, such as processor-based emulation system 100 shown in FIG. 1. Emulation engine 400 includes a processing system 402, a trace array 404, a memory 406, trace logic 408, RAM control logic 410, and multiplexers 412 and 414. Processing system 402 includes a plurality of processor clusters 416. Processor clusters 416 are specialized circuitry designed to execute Boolean equations and include multiple emulation processors (see FIG. 4B). In the embodiment shown, each processor cluster 416 includes 8 emulation processors. Processor clusters 416 can transfer data to one another via communications link 417. Memory 406 can be any suitable type of memory, such as dynamic random access memory (DRAM). Memory 406 can be on the same integrated circuit as the other components in processor-based emulation engine 400 or may comprise one or more separate integrated circuit devices.

Emulation data, i.e., data generated by the emulation processors when executing the user's design, is transferred between processing system 402 and multiplexer 412 via communication link 421. Trace data is transferred between processing system 402 and trace array 404 via communication links 422. Each communication link 422 provides a dedicated connection between a specific processor cluster 416 and trace array 404. Trace data is transferred between trace array 404 and multiplexer 412 via communication link 423. Emulation data or trace data is transferred between multiplexer 412 and memory 406 via communication link 425 depending on the value of select signal 424.

Emulation address signals are transferred between processing system 402 and multiplexer 414 via communication link 426. Trigger signals are transferred between processing system 402 and trace logic 408 via communication link 427. Trace address signals are transferred between RAM control logic 410 and multiplexer 414 via communication link 428. Emulation address signals or trace address signals are transferred between multiplexer 414 and memory 406 via communication link 429 depending on the value of select signal 424.

Emulation control signals are transferred between processing system 402 and RAM control logic 410 via communication link 430. Trace control signals are transferred between trace logic 408 and RAM control logic 410 via communication link 431. RAM control signals are transferred between RAM control logic 410 and memory 406 via communication link 432.

Figure 4B:
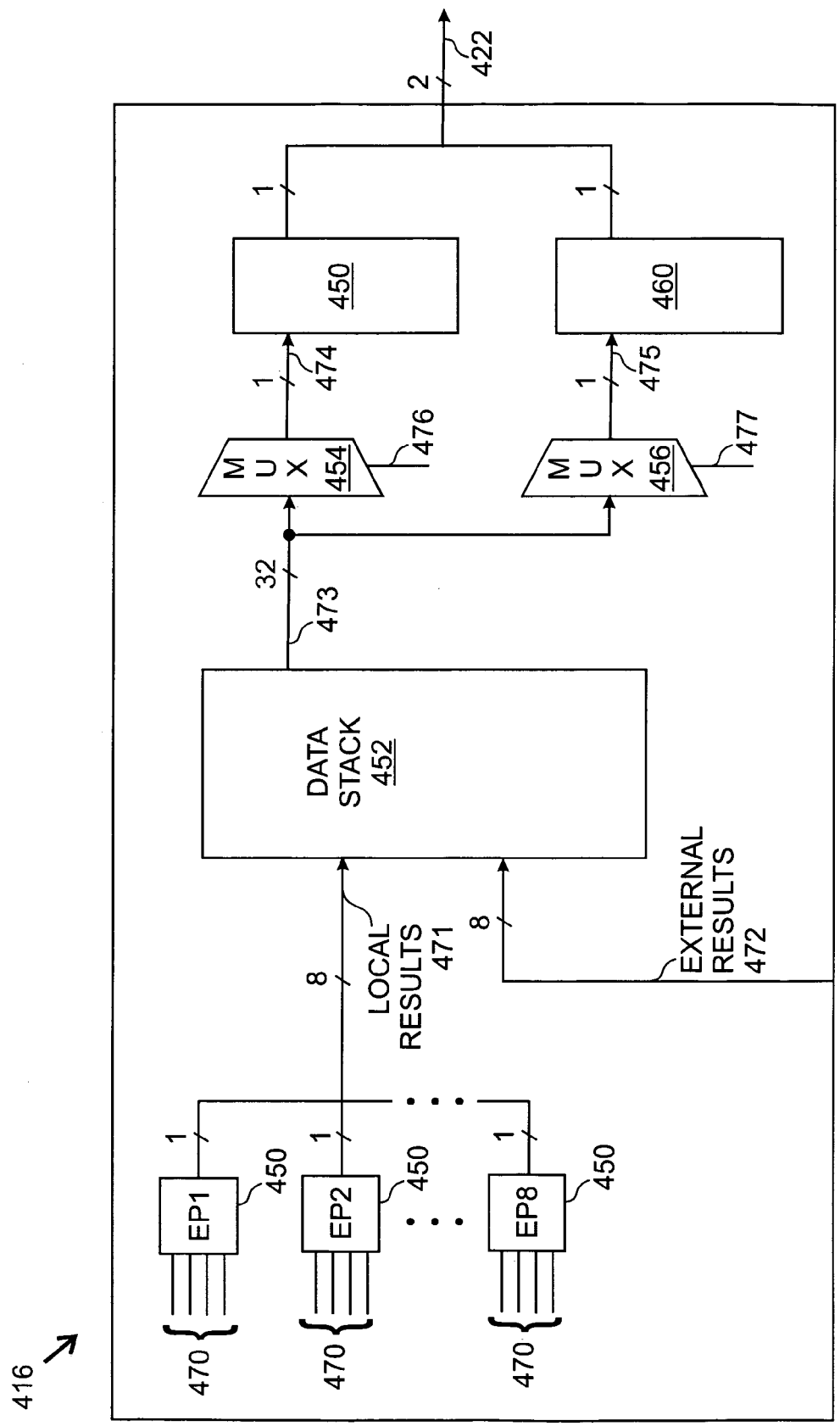
FIG. 4B shows an exemplary processor cluster in accordance with embodiments described herein.

FIG. 4B shows an exemplary processor cluster 416 like that used with the embodiments described herein. Processor cluster 416 includes eight emulation processors 450, a data stack 452, multiplexers 454 and 456, and capture registers 458 and 460. Emulation processors 450 and data stack 452 serve as emulation resources that are only used for emulating the integrated circuit design; they are not used for capturing the internal states of the integrated circuit design during emulation. In contrast, multiplexers 454 and 456 and capture registers 458 and 460 serve as capture resources for capturing the internal states of the integrated circuit design during emulation; they are not used for emulating the integrated circuit design. Processor cluster 416 can be implemented in a single integrated circuit. For example, a single integrated circuit can includes 96 processor clusters having 8 processors per cluster.

Each emulation processor 450 receives four (4) input bits via communication links 470. Each emulation processor outputs one bit of data, which is provided to data stack 452 via 8-bit communication link 471. Similarly, the 1-bit outputs of emulation processors from one or more other processor clusters (not shown) are provided to data stack 452 via 8-bit communication link 472. The 32-bit output of data stack 452 is transferred to multiplexers 454 and 456 via 32-bit communication link 473. Multiplexer 454 selects one of its 32 input bits depending on the value of selection signal 476 and provides the selected bit to register 458 via 1-bit communication link 474. Similarly, multiplexer 456 selects one of its 32 input bits depending on the value of selection signal 477 and provides the selected bit to register 460 via 1-bit communication link 475. Selection signals 476 and 477 are independent. This allows 2 of the 32 bits to be provided to registers 458 and 460. As explained in detail below, the data captured by registers 458 and 460 is trace data that can be used to determine the internal states of the integrated circuit design. The trace data is transferred between processor cluster 416 and trace array 404 (FIG. 4A) via 2-bit communication link 422.

Further details regarding processor clusters, such as processor clusters 416, and the emulation processors within the processor clusters, such as emulation processors 450, are described in U.S. Pat. No. 6,618,698 issued to Beausoleil et al. and in U.S. Pat. No. 5,551,013 issued to Beausoleil et al., both of which are hereby incorporated by reference. By arranging emulation processors into clusters, the processors within each cluster can share common emulation resources (e.g., input and data stacks) and improve communication between one another thereby increasing the efficiency and speed of an emulation as explained in U.S. Pat. No. 6,618, 698.

The operation of emulation engine 400 and processor clusters 416 will now be described with reference to FIGS. 4A, and 4B. After a user has completed an integrated circuit design, the user complies the design using specialized computer software running on host computer 102 (FIG. 1) or another computer. The compiled integrated circuit design is then loaded into the emulation processors 450 in emulation engine 400. It is important to note that, unlike conventional emulation engines, capture logic is not built into the compiled integrated circuit design and therefore is not loaded into emulation processors 450. This allows emulation processors 450 to be used solely for executing the logic in the integrated circuit design, allowing larger and more complex integrated circuit designs to be emulated in an emulation engine 400 of a given size.

The integrated circuit design is emulated by sequencing through a predetermined number of steps (e.g., 256), which is referred to as a major cycle. Each major cycle corresponds to a single clock cycle of the operating environment (e.g., a clock cycle in the target system). Each step corresponds to a clock cycle in the emulated integrated circuit design. Referring to FIG. 4B, 4 bits are provided to the input of each emulation processor 450 during each emulation step. Although a connection is not shown, the 4 bit inputs to each emulation processor 450 can be selected from any of the 32 bits output from data stack 452. Each emulation processor 450 executes a logical function (e.g., AND, OR, XOR, NOT, NOR, NAND, etc.) or a memory access function based on the values of the 4 input bits. Each emulation processor 450 then outputs a 1-bit result corresponding to the result of the logical or memory operation. The 1-bit outputs of the eight emulation processors 450 in a processor cluster 416 are then written to that processor cluster's data stack 452 via communication link 471. Additionally, the 1-bit outputs of emulation processors from one or more other processor clusters (not shown) are written to data stack 452 via 8-bit communication link 472.

Data stack 452 is 16 bits wide and 160 steps deep and therefore can store 2560 bits of data. The first eight bits of data stack 452 are used to store 1-bit outputs of the eight local emulation processors 450, and the second eight bits are used to store eight 1-bit outputs of emulation processors from one or more other processor clusters (not shown). Thus, 16 bits are stored in data stack 452 for each step in the emulation.

The internal states of the integrated circuit design can be captured on each emulation step (which is equivalent to a clock cycle of the emulation engine) using the capture resources within each processor cluster 416. Specifically, selection logic (not shown) selects 32 of the 2560 bits in data stack 452 and provides those bits to multiplexers 454 and 456 via communication link 473. Multiplexer 454 selects one of the 32 bits, depending on the value of selection signal 476, and that bit is stored in register 458. Likewise, multiplexer 456 selects another one of the 32 bits, depending on the value of selection signal 477, and that bit is stored in register 460. The two registered bits are then provided to trace array 404 via communication link 422.

It is important to recognize that emulation engine 400 can capture 25% of the emulation processor 450 outputs (2 of the 8 outputs) during each emulation step. Analysis has shown that Full-Vision can be achieved by capturing approximately 20% of the emulation processor 450 outputs. Therefore, emulation engine 400 provides Full-Vision capabilities. Furthermore, emulation engine 400 provides Full-Vision capabilities without using emulation resources (e.g., emulation processors 450) since emulation engine 400 includes dedicated capture resources.

As shown in FIG. 4A, either emulation data or trace data can be provided to memory 406. A user can read the emulation data or the trace data stored in memory 406 via host computer 102. Emulation data is stored in memory 406 as follows. Emulation data generated by the emulation processors 450 in processing system 402 is provided to multiplexer 412 via communication link 421. Selection signal 424 selects the emulation data input and multiplexer 412 provides the emulation data to memory 406 via communication link 425 where it is stored. At the same time, processing system 402 also provides emulation address signals to multiplexer 414 via communication link 426. Selection signal 424 selects the emulation address input and multiplexer 414 provides the emulation address to memory 406 via communication link 429. Processing system 402 also provides emulation control signals to RAM control logic 410 via communication link 430, which in turn provides RAM control signals to memory 406 via communication link 432.

Trace data is stored in memory 406 as follows. Trace data is provided to trace array 404 via 2-bit communication links 422. Trace array 404 is a memory device that temporarily stores the trace data pending the calculation of a trigger condition. Trace array 404 can, for example, be FIFO (First-In First-Out) memory device. Trace array 404 is a dedicated capture resource and is not used for emulating an integrated circuit design. If trace array 404 were not available, emulation resources, such as emulation processors 450, would have to be used to temporarily store the trace data pending calculation of the trigger condition. The trigger condition determines whether the trace data will be stored in memory 406 or whether the trace data will be discarded. Although the trigger condition is required to determine whether to capture the trace data, the evaluation of that condition may come after the data to be stored in memory 406 is available to trace array 404. This delay in the calculation of the trigger is due to the fact that the trigger may use signals that come from far away, including other chips or boards in the emulation engine. Although the trace data is stored in trace array 404, which is a dedicated, capture resource, the trigger condition is calculated using emulation resources.

If the trigger condition is valid, the trace data stored in trace array 404 is written to memory 406. To accomplish this, selection signal 424 will select the trace data input to multiplexer 412 and the trace address signals input to multiplexer 414, and appropriate trace address signals and trace control signals will be generated and provided to memory via communication links 429 and 432, respectively. When operating in Full-Vision mode, the trigger condition is always valid and all of the trace data is stored in memory 406.

The RAM address and RAM control lines are generated by special logic (not shown) in processing system 402. The RAM address and RAM control lines are shared between capture and emulation uses since memory 406 itself is used to store capture and emulation data. When operating in capture mode, the address and control signals are generated by dedicated capture resources and therefore do not use any of the emulation resources.

According to some embodiments, memory 406 is a DRAM. At the beginning of an emulation cycle, DRAM 406 can be set to burst mode. While in burst mode, the trace data can be written into DRAM 406 on every step in the emulation cycle. At the end of the emulation cycle, DRAM 406 can be taken out of burst mode and refreshed.

Those of skill in the art will recognize that emulation engine 400 provides numerous advantages over conventional emulation engines. First, using dedicated resources for capturing the trace data means that tracing can be achieved at a faster rate compared to using emulation resources. The fact that these capture resources are able to choose from the outputs of the local processor cluster for a number of previous steps before as well as outputs of other processors improves efficiency. Also activating tracing does not affect the number of processors available for emulation purposes. Memory is still shared, but the amount of memory can be increased so that the user still has memory available even when in Full-Vision mode. By using a trace array for conditional acquisition, a large amount of emulation resources are saved. Not having to store the trace data using emulation processors while waiting for the result of the trigger condition calculation means those processors can be used as emulation resources.

Second, emulation engine 400 allows different data to be captured without having to modify the emulated design. A user can capture different data by using different values for selection signals 476 and 477. In conventional processor-based emulation systems, a change in the data being captured would result in the need to recompile the design because the data that needed to be stored would have to be redirected to the correct emulation processor and the logic function that was being performed in that emulation processor would have to be moved to another emulation processor.

Finally, emulation engine 400 can be used to achieve Full-Vision in very large scale emulation systems, which it very difficult to achieve in practice. For example, a large scale emulation system under development by Cadence Design Systems includes a total of 884,736 emulation processors, which is the functional equivalent of approximately 256 million ASIC gates. The emulation processors in this system run at approximately 200 MHz. Using embodiments similar to those described herein, this emulation system can capture approximately 25% of all processor outputs, which is 221,184 bits per clock at 200 MHz. To capture this data, the emulation system uses numerous conventional RAM chips, each of which operates at 400 MHz (i.e., twice the rate of the 200 MHz emulation processor clock). Each RAM chip can capture 64 bits per emulation processor clock cycle. Thus, to capture the 221,184 bits output from the processors, a total of 3,456 RAM chips are used.

The bandwidth (bits per second) of this system is equal to 44 trillion bits/second (i.e., 211,184 bits×200 MHz). Additionally, the depth of the memory used in this system is 2M. This means that the emulation system has the ability to capture a total of 450 Billion bits of data. As those skilled in the art will appreciate, the amount of data that can be captured by this emulation system is extremely large and the ability to achieve Full-Vision in such a large scale emulation system is a significant technological achievement.

Those of skill in the art will recognize that numerous modifications can be made to emulation engine 400. As explained above, emulation engine 400 can capture 25% of the emulation processor outputs. Emulation engine therefore can implement Full-Vision since roughly 20% of the emulation processor outputs need to be captured to achieve Full-Vision. However, emulation engine 400 can easily be modified to expand capture other data if needed. For example, the number of bits captured could be increased and/or the depth of data stack 452 could be increased. If more output bits are captured, it less computation is required to achieve Full-Vision, which could potentially increase the speed of the system. Modifications can also be made so that capture registers 458 and 460 run at an increased speed allowing more data to be captured without increasing the amount of circuitry used for capturing data. Also, trace array 404 can be used to capture trace data in a more sophisticated manner. For example, trace array 404 could capture the amount of emulation processor outputs as needed for Full-Vision, but not during every step of the emulation. Using triggers only certain steps would be captured. This would provide Full-Vision, but only on "interesting" cycles. Emulation engine 400 can also be modified such that the emulation is stopped and then the capture resources are used to dump all data stacks 452 in emulation engine 400 into memory 406. This would provide the user with the outputs of every single processor in the chip for the last few cycles. This would include not only the values needed for something like Full-Vision, but also every intermediate value thereby giving the user complete design visibility without having to recreate the values of any processor outputs.

Those skilled in the art will also recognize that the embodiments disclosed herein are applicable to simulation accelerators as well as emulation engines. Since the underlying technology in both is uses processors, the embodiments disclosed herein are useful in both applications.

Various inventive concepts have been described with reference to specific embodiments above. It will, however, be evident that various modifications and changes may be made thereto without departing from the broader spirit and scope of the inventive concepts disclosed herein. For example, the reader is to understand that the specific ordering and combination of process actions described herein is merely illustrative, and the inventive concepts can be performed using different or additional process actions, or a different combination or ordering of process actions. The specification and drawings are, accordingly, to be regarded in an illustrative rather than restrictive sense, and the inventive concepts are not to be restricted or limited except in accordance with the following claims and their legal equivalents.

What is claimed is:

1. A system for emulating an integrated circuit design, the system comprising:
a plurality of processor clusters having emulation resources for emulating the integrated circuit design and generating emulation data having an emulation address and trace data having a trace address;
a memory for storing the emulation data and the trace data; and
capture circuitry dedicated for capturing the emulation data and the trace data during an emulation of the integrated circuit design, such that the emulation resources are not used for capturing data, the capture circuitry comprising:
a trace array temporarily storing the trace data;
a first multiplexor multiplexing the emulation data and the trace data; and
a second multiplexor multiplexing the emulation address and the trace address,
wherein the trace data and the trace address are conditionally stored in the memory when a trigger condition is valid.

2. The system of claim 1 wherein the memory is random access memory.

3. The system of claim 1 wherein each processor cluster includes a plurality of processors designed to emulate the integrated circuit design.

4. The system of claim 1 wherein the trace data is always stored in the memory in a full-vision mode.

5. The system of claim 1 wherein the capture circuitry further comprises a control logic, wherein the control logic receives an emulation control signal from the plurality of processor clusters.

6. The system of claim 5 wherein the capture circuitry further comprises a trace logic, wherein the trace logic receives trigger signals from the plurality of processor clusters and provides a trace control signal to the control logic.

7. The system of claim 1 wherein the plurality of processor clusters transfer data to one another via a communication link.

8. The system of claim 1 wherein the trace array is a FIFO (First-In-First-Out) memory.

9. The system of claim 1 wherein the processor clusters and the capture circuitry are implemented in a single integrated circuit.

10. A processor-based emulation system comprising:
a plurality of processor clusters, each of the processor clusters comprising a plurality of emulation processors and having emulation resources that execute logic from an integrated circuit design and generating emulation data having an emulation address and trace data having a trace address; and
capture circuitry dedicated to capture the emulation data and the trace data generated by the processor clusters during an emulation of integrated circuit design such that the emulation resources are not used for capturing data, the capture circuitry comprising:
a trace array temporarily storing the trace data;
a first multiplexor multiplexing the emulation data and the trace data; and
a second multiplexor multiplexing the emulation address and the trace address,
wherein the trace data and the trace address are conditionally stored in a memory when a trigger condition is valid.

11. The processor-based emulation system of claim 10, wherein the memory is in electrical communication with the capture circuitry.

12. The processor-based emulation system of claim 10 wherein each processor cluster includes a plurality of processors designed to emulate the integrated circuit design.

13. The processor-based emulation system of claim 10 wherein the trace data is always stored in the memory in a full-vision mode.

14. The processor-based emulation system of claim 10 wherein the capture circuitry further comprises a control logic, wherein the control logic receives an emulation control signal from the plurality of processor clusters.

15. The processor-based emulation system of claim 14 wherein the capture circuitry further comprises a trace logic, wherein the trace logic receives trigger signals from the plurality of processor clusters and provides a trace control signal to the control logic.

16. The processor-based emulation system of claim 10 wherein the plurality of processor clusters transfer data to one another via a communication link.

17. The processor-based emulation system of claim 10 wherein the trace array is a FIFO (First-In-First-Out) memory.

18. The processor-based emulation system of claim 10 wherein the processor clusters and the capture circuitry are implemented in a single integrated circuit.

* * * * *